(12) United States Patent
Dent et al.

(10) Patent No.: US 6,768,391 B1
(45) Date of Patent: Jul. 27, 2004

(54) CLASS-B BIASED GILBERT CELLS AND QUADRATURE MODULATORS

(75) Inventors: Paul W. Dent, Pittsboro, NC (US); Aristotle Hadjichristos, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 924 days.

(21) Appl. No.: 09/602,385

(22) Filed: Jun. 22, 2000

(51) Int. Cl.[7] .............................. H03C 1/00; H03C 3/00
(52) U.S. Cl. ...................... 332/185; 332/103; 332/149; 327/359; 375/295; 375/298; 455/333
(58) Field of Search ................................. 332/100, 103, 332/106, 117, 144, 149, 185; 327/355–359; 455/333; 375/261, 271, 295, 298, 302

(56) References Cited

U.S. PATENT DOCUMENTS

| 4,156,283 | A |   | 5/1979  | Gilbert .................... 364/841 |
| 5,495,194 | A |   | 2/1996  | Sugawara |
| 5,530,722 | A |   | 6/1996  | Dent ......................... 375/398 |
| 5,574,755 | A |   | 11/1996 | Persico ..................... 375/395 |
| 5,805,987 | A |   | 9/1998  | Kamase |
| 5,847,623 | A |   | 12/1998 | Hadjichristos ............. 332/105 |
| 5,920,810 | A |   | 7/1999  | Finol et al. |
| 6,037,825 | A | * | 3/2000  | Kung ......................... 327/359 |

FOREIGN PATENT DOCUMENTS

| EP | 0 073 929 A2 | 3/1983 |
| GB | 2 291 753 A  | 1/1996 |
| WO | WO 96/08865 A2 | 3/1996 |

OTHER PUBLICATIONS

Gray et al., *Analysis and Design of Analog Integrated Circuit*, Third Edition, John Wiley & Sons, Inc., 1993, pp. 670–675.
TIA/EIA–136–133–A Draft Text, *Digital Traffic Channel Layer 3*, Aug. 31, 1999.
TIA/EIA–136–131–A Draft Text, *Digital Traffic Channel Layer 1*, Aug. 31, 1999.
TIA/EIA–136–000–A Draft Text, *List of Parts*, Aug. 31, 1999.
International Search Report, PCT/US01/18077, Oct. 29, 2002.

\* cited by examiner

*Primary Examiner*—David Mis
(74) *Attorney, Agent, or Firm*—Myers Bigel Sibley & Sajovec

(57) ABSTRACT

Quadrature modulators include a quadrature splitter and a pair of Gilbert Multiplier Cells coupled to the quadrature splitter, each of which is biased in Class-B. The quiescent current bias in the Gilbert Multiplier Cells may be substantially zero. Each of the Gilbert Multiplier Cells may include a pair of cross-coupled, emitter-coupled transistor pairs transistor pairs and a driver circuit that is coupled to at least one of the emitter-coupled transistor pairs and that is biased in Class-B. The driver circuit may include at least one current mirror circuit that is coupled to at least one of the emitter-coupled transistor pairs. The driver circuit also may include at least one current source that selectively applies current to at least one of the emitter-coupled transistor pairs, more specifically by selectively applying current to the at least one current mirror circuit.

50 Claims, 9 Drawing Sheets

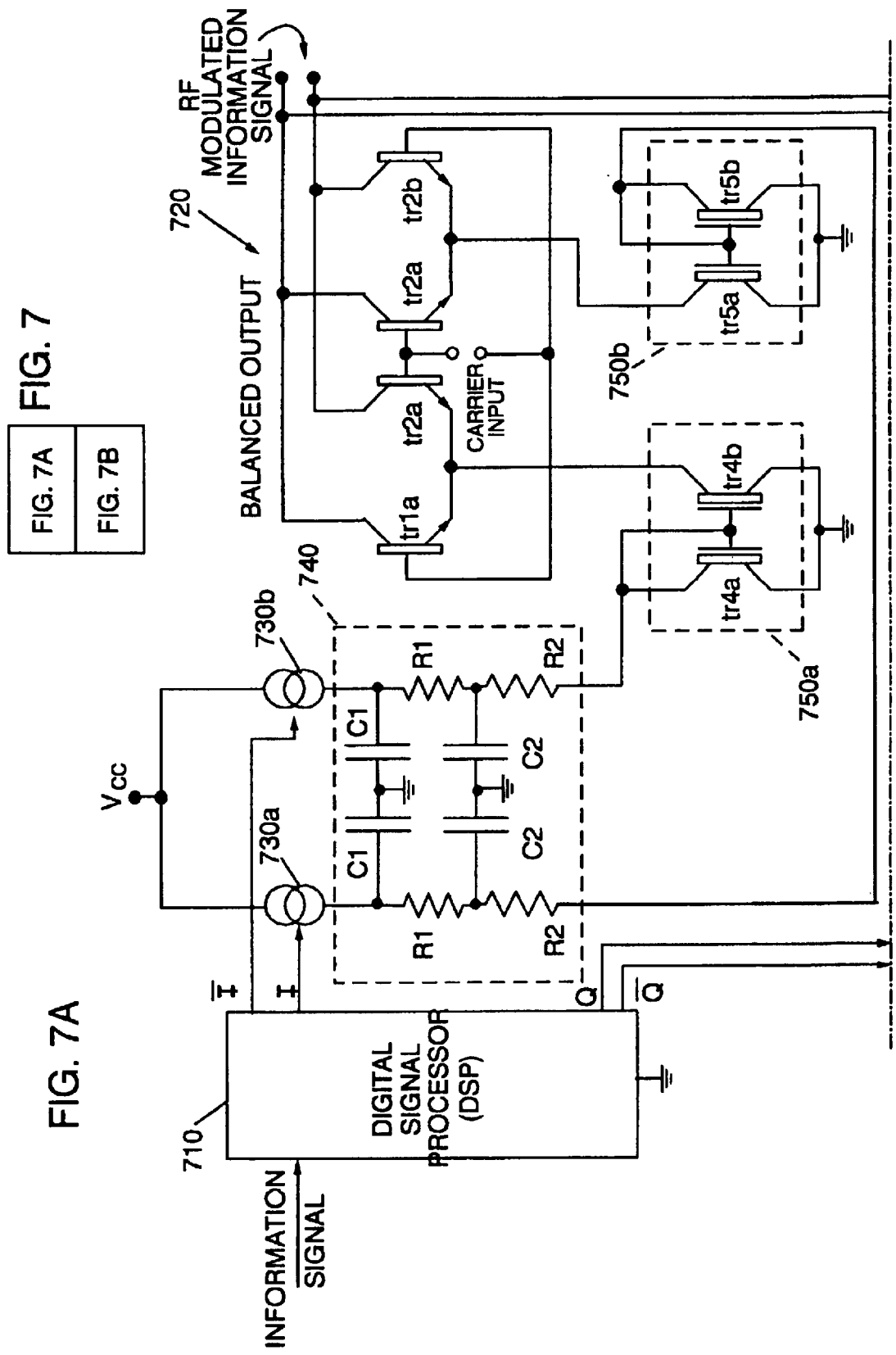

CLASS-A
W⁺ IS THE CURRENT
WAVEFORM IN TR3A
W⁻ IS THE CURRENT
WAVEFORM IN TR3B

CLASS-B
W⁺ IS THE CURRENT
WAVEFORM IN tr4a/b
W⁻ IS THE CURRENT
WAVEFORM IN tr5a/b

CLASS-B BIASED GILBERT CELLS AND QUADRATURE MODULATORS

BACKGROUND OF THE INVENTION

This invention relates to modulator or mixer circuits and related methods, and more particularly to Gilbert cell modulators and related methods.

Modulation systems and methods are widely used in transmitters to modulate information including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile terminal, a modulator may be used in the transmitter thereof, to modulate an input signal (voice and/or data) for wireless transmission.

A particular type of modulator which is widely used is the "Gilbert Multiplier Cell" also referred to as the "Gilbert modulator", the "Gilbert cell" or the "Gilbert mixer". The Gilbert Multiplier Cell includes an emitter coupled transistor pair, also referred to as the "lower transistors" or "driver transistors", which is coupled to a pair of cross-coupled emitter-coupled transistor pairs, also referred to as the "upper transistors", "switch transistors" or "active mixer transistors". One set of cross-coupled, emitter-coupled transistor pairs of the upper transistors and one of the lower transistors also is referred to as a "long-tailed pair". A data input, which can include an analog or digital voice and/or data input, is coupled to the emitter-coupled transistor pair. A local oscillator is coupled to the pair of cross-coupled, emitter-coupled transistor pairs, to produce a modulated output.

Gilbert Multiplier Cells are described in U.S. Pat. No. 4,156,283 to Gilbert entitled *Multiplier Circuit*. The Gilbert Multiplier Cell also is extensively described and analyzed in Section 10.3 of the textbook *Analysis and Design of Analog Integrated Circuits* by Paul Gray and Robert Meyer, John Wiley and Sons, NY, 1993, pp. 670–675, the disclosure of which is incorporated herein by reference.

A pair of Gilbert Multiplier Cells may be used to produce a quadraphase modulator, also known as an "IC/IQ modulator", an "I/Q quadrature modulator" or a "quadrature modulator". Quadraphase modulators are described in U.S. Pat. No. 5,574,755, to Persico entitled *I/Q Quadraphase Modulator Circuit*, U.S. Pat. No. 5,530,722 to coinventor Dent, entitled *Quadrature Modulator With Integrated Distributed-RC Filters* and U.S. Pat. No. 5,847,623 to coinventor Hadjichristos entitled *Low Noise Gilbert Multiplier Cells and Quadrature Modulators*, the disclosures all of which are hereby incorporated herein by reference in their entirety.

SUMMARY OF THE INVENTION

Embodiments of the present invention can provide quadrature modulators that comprise a quadrature splitter and a pair of Gilbert Multiplier Cells coupled to the quadrature splitter that are biased in Class-B. As is well known to those having skill in the art, a Class-B circuit is biased at zero DC current so that a transistor in a Class-B stage conducts for only half of the cycle of an input sine wave. In contrast, a Class-A circuit is biased at a current that is greater than the amplitude of the signal current, so that a transistor in Class-A conducts for the entire cycle of the input signal. The quiescent current bias in the Gilbert Multiplier Cells may be substantially zero. Accordingly, reduced power consumption may be provided.

Each of the Gilbert Multiplier Cells may comprise a pair of cross-coupled, emitter-coupled transistor pairs and a driver circuit that is coupled to at least one of the emitter-coupled transistor pairs and that is biased in Class-B. The driver circuit may include at least one current mirror circuit that is coupled to at least one of the emitter-coupled transistor pairs. The driver circuit also may comprise at least one current source that selectively applies current to at least one of the emitter-coupled transistor pairs, more specifically by selectively applying current to the at least one current mirror circuit. Accordingly, the Gilbert Multiplier Cell is biased in Class-B.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
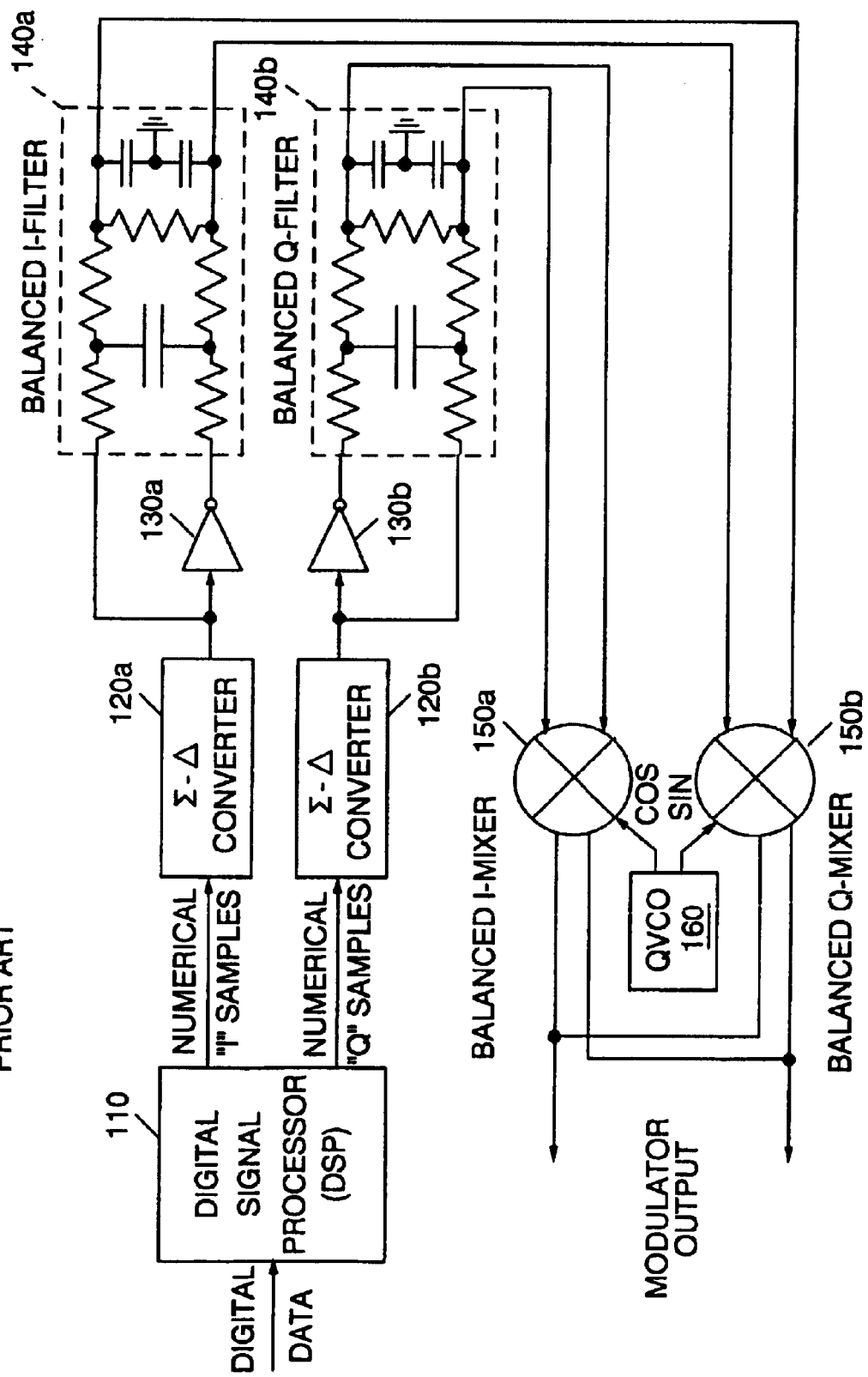
FIG. 1 is a block diagram of quadrature modulators according to U.S. Pat. No. 5,530,722.

In order to provide an appropriate theoretical background for understanding embodiments of the present invention, a detailed analysis of quadrature modulators incorporating Gilbert cells according to the above-incorporated U.S. Pat. No. 5,530,722 first will be described. FIG. 1 illustrates an embodiment of a quadrature modulator according to above-incorporated U.S. Pat. No. 5,530,722.

Referring now to FIG. 1, digital information to be modulated is input to a Digital Signal Processor (DSP) 110 that converts the digital information to I and Q modulating signals. The I and Q modulating signals are converted to highly oversampled (high bit rate) sigma-delta representation in converters 120a and 120b, in which the instantaneous value of an I or Q signal is represented by the relative proportions of binary 1's to binary 0's in the sigma-delta bitstream. Inverters 130a, 130b form the complementary bitstreams. The sigma-delta I and Q bitstreams and their complements are fed to balanced filters 140a, 140b which smooth the sigma-delta bitstreams to form continuous-time, balanced I and Q signals. Conventional balanced filters, 140a, 140b generally operate with a signal voltage input and generally provide a smoothed signal voltage output. The balanced, filtered I,Q signals are applied to a quadrature modulator including an I-modulator or mixer 150a for modulating the I-signal to a cosine wave carrier frequency signal and a Q-modulator or mixer 150b for modulating the Q-signal to a sine wave carrier frequency signal. The cosine and sine wave carrier frequency signals are supplied by a quadrature Voltage Controlled Oscillator (QVCO) 160 also referred to a quadrature splitter, which may be locked to a reference frequency crystal by a digital frequency synthesizer phase-lock-loop circuit.

Figure 2:
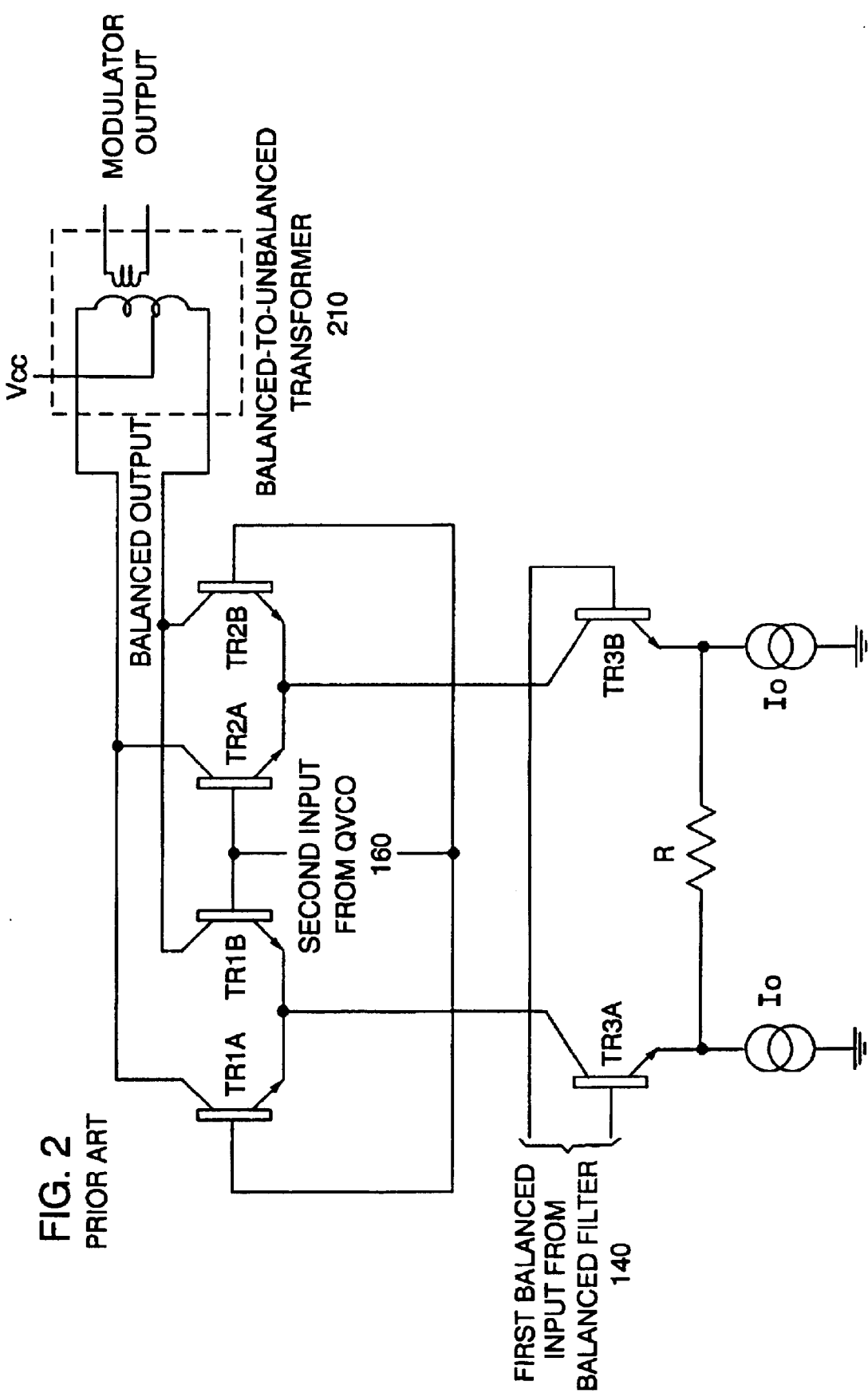
FIG. 2 is a circuit diagram of a conventional Gilbert cell that may be used in modulators of FIG. 1.

Each of the I or Q modulators 150a, 150b preferably is a Gilbert cell as shown in FIG. 2. Referring now to FIG. 2, a first long-tailed pair comprising TR1A, TR1B and TR3A is coupled with a second long-tailed pair comprising TR2A, TR2B and TR3B. Current sources, each of output current Io, are connected to the tail transistors TR3A, TR3B so that both long-tailed pairs are biased to the same quiescent current level. Class-A biasing thereby is provided. The currents in the respective transistors are then:

TR3A Io
TR1A Io/2
TR1B Io/2
TR3B Io
TR2A Io/2
TR2B Io/2 assuming that a zero voltage difference exists at the second input.

Resistor R is connected between the emitters of tail transistors TR3A and TR3B such that a differential input voltage at the first input of V1 will cause a current V1/R to flow in the resistor. This current adds to one of the tail transistors, e.g. TR3A, raising its current to Io+V1/R, and subtracts from the other, e.g. TR3B, reducing its current to Io−V1/R.

At this point the current in the transistors is:

TR3A Io+V1/R
TR1A Io/2+V1/2R
TR1B Io/2+V1/2R
TR3B Io−V1/R
TR2A Io/2−V1/2R
TR2B Io/2−V1/2R again assuming zero differential at the second input.

The collectors of TR1A and TR2A are joined to form one wire of the two-wire, balanced output. The sum of the currents in this wire is thus $$(Io/2+V1/2R)+(Io/2-V1/2R)=Io.$$

Likewise the collectors of TR1B and TR2B are joined to form the second wire of the differential output and their current sum is also Io. The differential output current signal is thus Io−Io=zero. If the balanced output is converted to an unbalanced output using, for example, a balanced-to-unbalanced transformer 210, then the output signal at this point is zero while the total current consumption of the circuit from the power supply Vcc is 2·Io. Thus, a power consumption of 2·Vcc·Io watts is produced.

If now a voltage difference V2 is applied to the second input, with the TR1A and TR2B bases receiving the higher voltage (+V$_2$/2) and the TR1B and TR2A bases receiving the lower voltage (−V$_2$/2), then TR1A will take more of the total current coming from TR3A of Io+V1/R than will TR1B, the split being in the ratio:

$$EXP(kV_2/2):EXP(-kV_2/2).$$

The currents in the transistors are then:

TR3A Io+V1/R
TR1A (Io/2+V1/2R)exp(kV$_2$/2)/2·cos h(kV$_2$/2)
TR1B (Io/2+V1/2R)exp(−kV$_2$/2)/2·cos h(kV$_2$/2)
TR3B Io−V1/R
TR2A (Io/2−V1/2R)exp(−kV$_2$/2)/2·cos h(kV$_2$/2)
TR2B (Io/2−V1/2R)exp(kV$_2$/2)/2·cos h(kV$_2$/2).

The sum of the collector currents of TR1A and TR2A now equals:

$$TR1A+TR2A=Io+(V1/R)\cdot \tan h(kV_2/2)$$

and likewise:

$$TR1B+TR2B=Io+(V1/R)\cdot \tan h(kV_2/2).$$

The difference in the balanced output currents is thus:

$$2(V1/R)\cdot \tan h(kV_2/2)$$

which, for small V2 where the tan h function is approximately linear, reduces to:

$$(k/R)V1\cdot V2$$

thus illustrating the multiplication of the voltage difference V1 at the first input with the differential voltage V2 at the second input. The first input is a linear input due to the degenerating resistor R, and is the input for modulating voltages V1, for example from a balanced filter 140 of FIG. 1, that should be faithfully modulated without distortion. The second input is only quasi-linear, and is usually used for the carrier frequency signal V2, for example from a QVCO 160 of FIG. 1, as distortion of the carrier signal only produces harmonics which can be removed by harmonic filtering. Indeed it is common to drive the second input with a square wave V2 signal such that the split of current between TR1A and TR1B switches from all in TR1A, zero in TR1B to all in TR1B and zero in TR1A, and likewise for TR2A, TR2B. When a square-wave or large signal swing is applied to the second input, the currents in the transistors are:

TR3A Io+V1/R Io+V1/R
TR1A Io+V1/2R zero
TR1B zero Io+V1/2R either or
TR3B Io−V1/R Io−V1/R
TR2A zero Io−V1/R
TR2B Io/2−V1/2R zero.

The output collector currents are then:

$$TR1A+TR2A=Io+V1/R \text{ or } Io-V1/R$$

$$TR1B+TR2B=Io-V1/R \text{ or } Io+V1/R$$

and the difference current (the balanced output current) is then 2V1/R or −2V1/R, alternating at the carrier frequency.

If only the fundamental component of this square-wave differential output current is useful, the amplitude of the fundamental component of a square wave being 2/π times its peak-to-peak value, then the useful output carrier frequency current amplitude is $(8/\pi)V1/R$ and its rms value is a factor $\sqrt{2}$ lower than the above amplitude. Since the current in TR1B+TR2B may not be negative, it may be seen that V1/R is less than Io, i.e. V1<Io·R. The maximum useful differential output current is thus obtained by replacing V1 by Io/R, obtaining $(8/\pi)$·Io or $(4\sqrt{2}/\pi)$·Io rms.

If V1 varies in a sine wave fashion within the allowable maximum value Io·R, the mean rms output will be less than the above by a further factor of $\sqrt{2}$, giving $(4/\pi)$ Io as the maximum, signal-power-related, useful output current, while the DC current consumption is a constant 2Io. Moreover, the DC current is consumed from the constant supply voltage Vcc, while the output signal swing on each of the output lines would typically only be Vcc/2 when the Gilbert cell is operated from low battery voltages. This is because the available battery voltage is shared between the switching transistors (TR1A, TR1B, TR2A, TR2B) and the tail transistors (TR3A, TR3B). The maximum useful output power with a sine wave waveform for V1 is then calculated to be $(\sqrt{2}/\pi)$Vcc·Io while the DC power consumed is 2Vcc·Io, giving an efficiency of $1(\sqrt{2}/\cdot\pi)$ or about 22%. In practice, this would be substantially less as it would not usually be possible to allow V1 to reach the maximum value of Io·R with acceptable distortion.

Quadrature modulators according to embodiments of the present invention comprise an In-Phase or "I" modulator including a first pair of coupled, long-tailed pairs and a Quadrature or "Q" modulator including a second pair of coupled, long-tailed pairs, each of the "I" and "Q" modulators forming a Gilbert cell. In contrast with a conventional Gilbert cell modulator, the quiescent current bias in the tail circuits is substantially zero. During modulation, when the I or Q modulating signal is instantaneously positive, one of the pairs of long-tailed pairs of the respective I or Q modulators is caused to pass a current proportional to the positive value of the modulating signal. Alternatively, when the I or Q modulating signal is instantaneously negative, the opposite one of the pair of long-tailed pairs of the respective I or Q modulator is caused to pass a current proportional to the magnitude of the negative modulating signal. Each pair of long-tailed pairs of each modulator preferably is driven in antiphase with a carrier frequency signal and the outputs of both I and Q pairs of long-tailed pairs are coupled together. The carrier frequency signal applied to one pair of long-tailed pairs is in 90-degree phase quadrature with the carrier frequency signal applied to the other pair of long-tailed pairs. The above arrangement may be regarded as a quadrature modulator using two balanced modulators operating in Class-B (i.e. substantially zero quiescent current) as opposed to the Class-A operation (constant bias current) of conventional Gilbert cell quadrature modulators.

Embodiments of modulators that modulate an information signal onto a carrier signal to produce a modulated information signal, according to the present invention, include a generating circuit that is configured to produce a first modulating signal that corresponds to those portions of the information signal having positive values, and a second modulating signal that corresponds to those portions of the information signal having negative values. A first half modulator is configured to modulate the carrier signal with the first modulating signal to produce a first half modulated signal. A second half modulator is configured to modulate the carrier signal with the second modulating signal, to produce a second half modulated signal. A combining circuit is configured to combine the first half modulated signal and the second half modulated signal, to produce the modulated information signal.

Embodiments of the generating circuit comprise a sorter that is configured to sort the portions of the information signal having positive values and the portions of the information signal having negative values, to produce the first and second modulating signals. Embodiments of the generating circuit also may comprise a first sigma-delta converter that is responsive to the portions of the information signal having positive values, to produce the first modulating signal as a first sigma-delta bitstream. A second sigma-delta converter is responsive to the portions of the information signal having negative values, to produce the second modulating signal as a second sigma-delta bitstream. A first current source is enabled and disabled in response to the first sigma-delta bitstream, wherein the first half modulator is configured to modulate the carrier signal in response to the first current source, to produce the first half modulated signal. A second current source is enabled and disabled in response to the second sigma-delta bitstream, wherein the second half modulator is configured to modulate the radio frequency carrier signal in response to the second current source, to produce the second half modulated signal. A first low pass filter also may be provided that connects the first current source to the first half modulator. A second low pass filter may connect the second current source to the second half modulator.

In other embodiments, the first half modulator comprises a first current mirror circuit that is responsive to the first modulating signal to produce a current scaled replica of the first modulating signal. The second half modulator preferably comprises a second current mirror circuit that is responsive to the second modulating signal, to produce a current scaled replica of the second modulating signal.

In yet other embodiments, the first half modulator also comprises a first switching circuit that switches the current scaled replica of the first modulating signal at a rate that is based upon the carrier signal. The second half modulator also comprises a second switching circuit that switches the current scaled replica of the second modulating signal at a rate that is based upon the carrier signal. The combining circuit may comprise a node that is configured to directly couple the first half modulated signal and the second half modulated signal, to produce the modulated information signal. In other embodiments, more complex combining circuits may be used.

Accordingly, in embodiments of the present invention, the tail currents of the long-tailed pairs are caused to follow respective modulating signals by means of a current mirror circuit, in which a modulating current is applied to a first transistor to generate a voltage related to the current, and a second, mirror-transistor is biased using the generated voltage so as to "mirror" the modulating current proportionally. According to other embodiments, the modulating current is provided by switching a current source on and off with a high bit rate binary stream produced by a sigma-delta modulator. The switched current source output current then is smoothed using a shunt resistor (R) and series capacitor (C) circuit forming a dual low-pass filter. By avoiding any shunt R in the low pass filter, the mirror current can follow the desired modulating current without being affected by the transistor input offset voltage due to the base-to-emitter voltage drop (Vbe) of a bipolar transistor or the threshold voltage (Vt) of a field effect transistor.

Other embodiments of the present invention generate a ternary valued information signal, comprising a stream of ternary digits, each having notational values of +1, 0 and −1. The generating circuit is configured to produce the first modulating signal that comprises first logic levels that correspond to the ternary digits having +1 notational values and second logic levels. The generating circuit also is configured to produce the second modulating signal that comprises first logic levels that correspond to the ternary digits having −1 notational values and second logic levels. A first current source is enabled by the first logic levels of the first modulating signal and disabled by the second logic levels of the first modulating signal. The first half modulator is configured to modulate the carrier signal in response to the first current source to produce the first half modulated signal. A second current source is enabled by the first logic levels of the second modulating signal and is disabled by the second logic levels of the second modulating signal. The second half modulator is configured to modulate the carrier signal in response to the second current source to produce the second half modulated signal. A first low pass filter connects the first current source to the first half modulator and a second low pass filter connects the second current source to the second half modulator.

Other embodiments of quadrature modulators according to the present invention include a generating circuit that is configured to produce in-phase (I) samples and quadrature (Q) samples of the information signal. A converter is configured to convert the I samples of the information signal into a continuous I waveform and continuous complementary-I waveform and also is configured to convert the Q samples of the information signal into a continuous Q waveform and a continuous complementary-Q waveform. At least one current mirror is responsive to the converter to produce proportional currents that are proportional to the continuous I waveform, the continuous complementary-I waveform, the continuous Q waveform and the continuous complementary-Q waveform. A switching circuit is configured to alternatingly switch the proportional currents to first and second output terminals under control of switching signals at the frequency of the carrier signal, to produce the modulated information signal at the first and second output terminals.

In other embodiments, a difference between the continuous I waveform and the continuous complementary-I waveform represents a real part of the information signal and a difference between the continuous Q waveform and the continuous complementary-Q waveform represents an imaginary part of the information signal. In yet other embodiments, the continuous I waveform represents positive portions of the real part of the information signal and the continuous complementary-I waveform represents negative portions of the real part of the information signal. The continuous Q waveform represents positive portions of an imaginary part of the information signal and the continuous complementary-Q waveform represents negative portions of the imaginary part of the information signal.

It will be understood that although the above description has concentrated primarily on Gilbert Multiplier Cells and modulator systems, modulating method embodiments and Gilbert Multiplier Cell operating method embodiments also may be provided.

Figure 3:
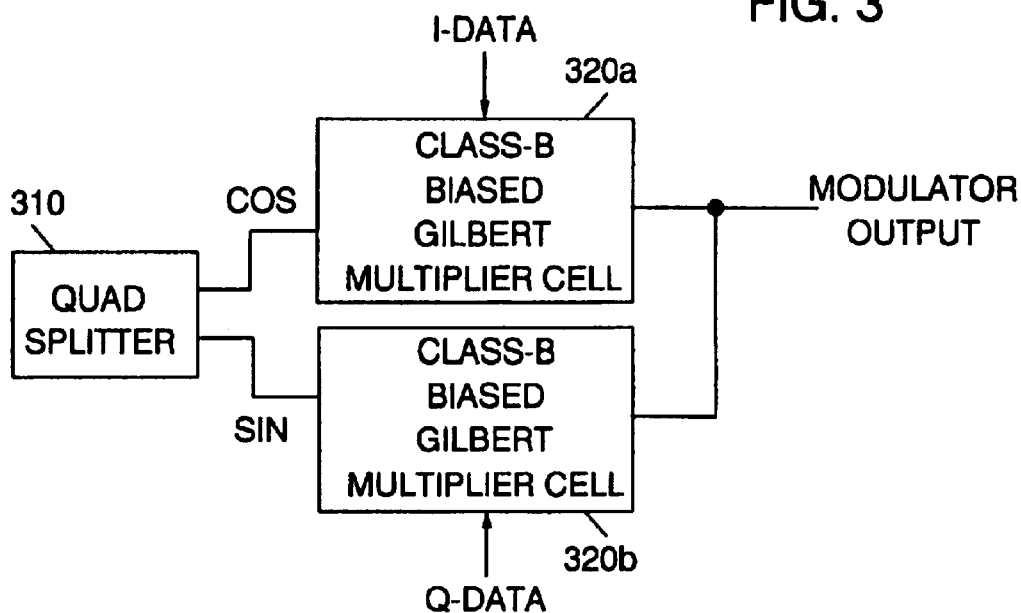
FIGS. 3–6 are block diagrams of embodiments of Class-B biased Gilbert cells and quadrature modulators according to the present invention.

FIG. 3 is a block diagram of embodiments of quadrature modulators according to the present invention. As shown in FIG. 3, these embodiments of quadrature modulators include a quadrature splitter 310 that is configured to generate 90° out-of-phase signals, shown as cos and sin in FIG. 3. First and second Class-B biased Gilbert Multiplier Cells 320a and 320b also are provided, a respective one of which is responsive to a respective one of the 90° out-of-phase signals from the quad splitter 310. The first Class-B biased Gilbert Multiplier Cell 320a also is responsive to I-data and the second Class-B biased Gilbert Multiplier Cell 320b also is responsive to Q-data. The outputs of the first and second Class-B biased Gilbert Multiplier Cells 320a and 320b are combined to produce a modulator output.

Figure 4:
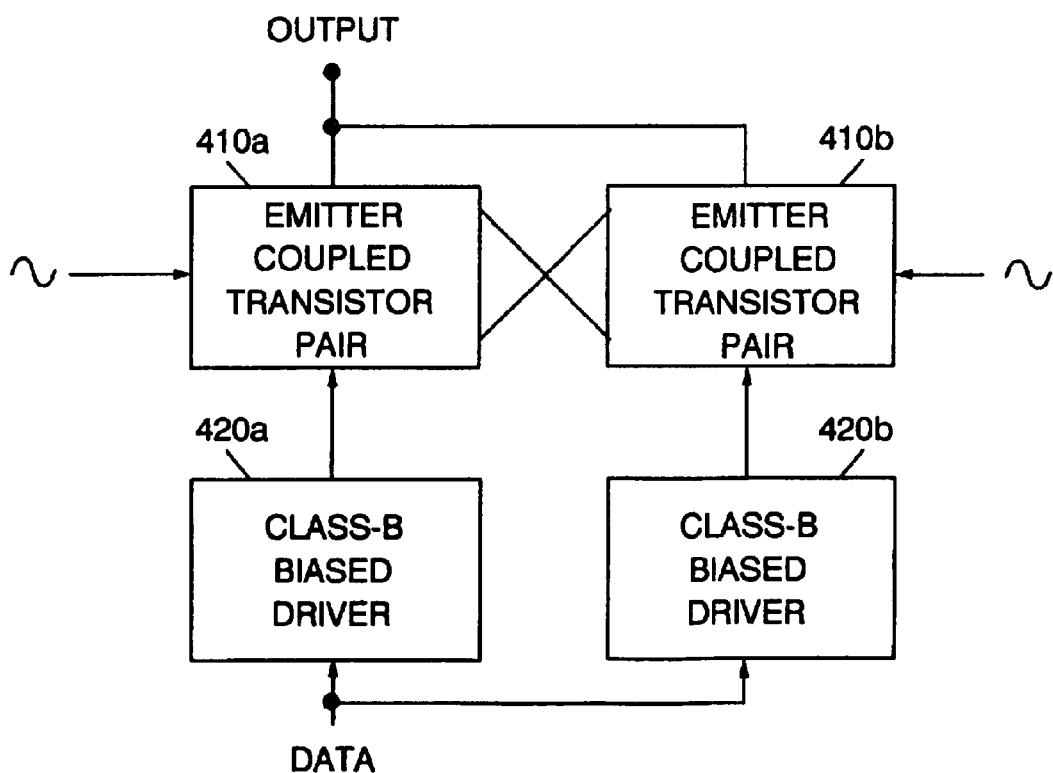

FIG. 4 is a block diagram of embodiments of Class-B biased Gilbert Multiplier Cells according to the present invention that may be used in FIG. 3 blocks 320a and 320b. As shown in FIG. 4, these embodiments of Class-B Gilbert Multiplier Cells include a pair of emitter-coupled transistor pairs 410a, 410b, each of which is responsive to a local oscillator signal, shown as a sinusoidal wave (~). The Class-B biased Gilbert Multiplier Cell also includes at least one Class-B biased driver 420a, 420b that drives the pair of emitter-coupled transistor pairs 410a and 410b. The Class-B biased drivers 420a and 420b are responsive to data signals such as I-data or Q-data. As will be described in detail below, a respective Class-B biased driver 420a, 420b also may be responsive to I-data and the complement of I-data respectively.

Figure 5:
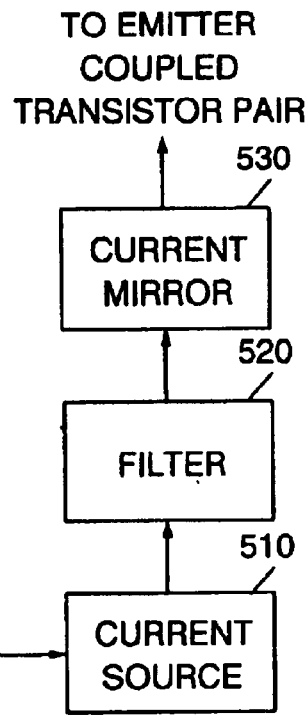

FIG. 5 is a block diagram of embodiments of Class-B biased drivers for Gilbert Multiplier Cells according to the present invention, that may be used in FIG. 4 blocks 420a and 420b. As shown in FIG. 5, these embodiments of Class-B biased drivers may include a current source 510 that is responsive to a data input such as an I-data or Q-data input, to selectively provide current. A filter 520, such as a low pass filter, is responsive to the current source 510, and a current mirror 530 is responsive to the filtered signal from filter 520. The current mirror 530 scales the current and supplies the scaled current to one or more emitter-coupled transistor pairs, such as blocks 410a or 410b of FIG. 4.

Figure 6:
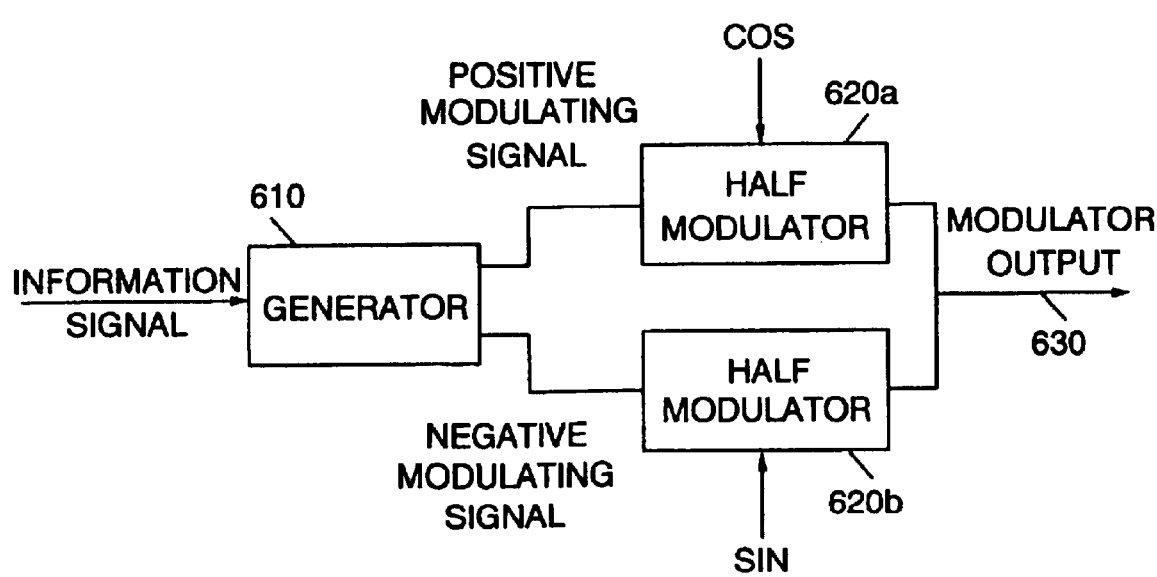

FIG. 6 is a block diagram of other embodiments of modulators such as quadrature modulators according to the present invention. As will be described in detail below, modulators according to the present invention modulate an information signal onto a carrier signal such as a radio frequency carrier signal, to produce a modulated information signal. A generator 610 is configured to produce a first modulating-signal that corresponds to those portions of the information signal having positive values and a second modulating signal that corresponds to those portions of the information signal having negative values. A first half modulator 620a modulates the carrier signal with the first (positive) modulating signal, to produce a first half modulated signal. A second half modulator 620b modulates the carrier signal with the second (negative) modulating signal, to produce a second half modulated signal. A combining circuit 630 combines the first half modulated signal and the second half modulated signal, to produce the modulated information signal. The combining circuit may be a node 630 that directly couples the first half modulated signal and the second half modulated signal to produce the modulated information signal. In other embodiments, more complex combining circuits may be provided. Each of the half modulators 620a, 620b can comprise a Class-B biased Gilbert Multiplier Cell, for example as was described in FIGS. 3–5.

Figure 7B:
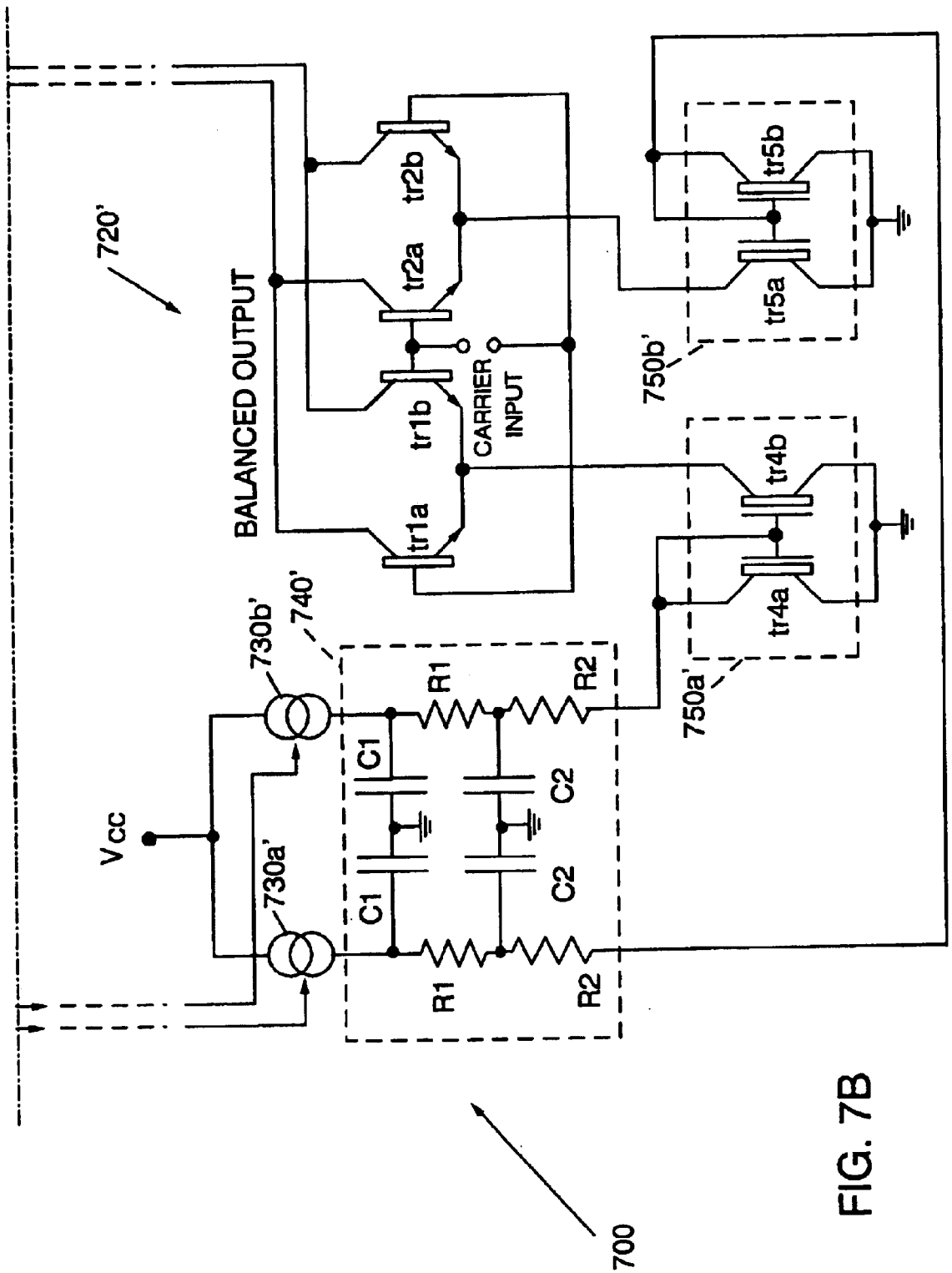
FIG. 7, comprising FIGS. 7A and 7B in side-by-side relationship as indicated, is a circuit diagram of embodiments of Class-B modulators and Gilbert cells according to the present invention.

FIG. 7, comprising FIGS. 7A and 7B as indicated, is a circuit diagram of embodiments of Class-B modulators according to the present invention. Referring now to FIG. 7, a digital signal processor (DSP) 710, that can be similar to the DSP 110 of FIG. 1, is configured to generate high bit rate sigma-delta representations of I and Q modulating signals in complementary pairs (I, $\bar{I}$) and (Q, $\bar{Q}$). However, these waveform pairs are preferably complementary in a different sense than is conventionally meant, as will be explained below.

Only the treatment of the I modulating signal will be described in detail. The Q modulating signal is treated similarly in FIG. 7, with like elements indicated by prime (') notation. The I signal and the complementary-I signal are used to enable/disable respective current sources 730a, 730b such that they operate alternately to supply current. The currents from current sources 730a, 730b are filtered in balanced (or matched) filters 740 comprised of resistor values R1 (2 each), R2 (2 each), C1 (2 each) and C2 (2 each). The balanced/matched filter 740 can be the dual of the balanced filters 140a, 140b of FIG. 1. Specifically, instead of filtering a voltage source to drive a high-impedance load (modulators 150a, 150b of FIG. 1) the filter 740 filters a current to drive a low-impedance load (current mirrors 750a, 750b). Thus, the filter 740 may be similar to filters 140a, 140b reversed end-to-end.

The embodiments of the balanced filter 740 shown in FIG. 7 is merely illustrative and may comprise more or fewer sections and components than the two RC-sections shown. Also, some of the resistors may be replaced by series inductors to provide a steeper cutoff LC-filter. However, these filters preferably should have the structure of the embodiment illustrated in FIG. 7, which is characterized by shunt capacitors nearest to the current sources 730a, 730b, series resistors nearest to the current mirrors 750a, 750b and having no shunt conductive elements, only shunt capacitive elements C1 and C2. The latter can cause the mean value of the output current to the current mirrors 750a and 750b to be equal to the mean value of the current from the current sources 730a and 730b, regardless of the threshold voltage of the current mirror transistors (tr4a, tr4b, tr5a, tr5b).

The balanced current filter 740 smoothes the current from the current source 730a or 730b and applies the smoothed current to the current mirrors 750a and 750b. Embodiments of the current mirrors each comprise a pair of matched transistor types that differ only in a gate length scaling. As indicated, the transistor type is a field effect transistor such as a CMOS transistor, although other embodiments can use bipolar transistor current mirrors that account for the finite base current thereof Since tr4a and tr4b have the same gate-source voltage, the current in tr4b will be an accurately scaled version of the current in tr4a, and likewise for tr5a and tr5b. The scaled current from tr4b splits between transistors tr1a and tr1b in a ratio determined by the carrier signal input, as previously explained for the conventional Gilbert cell. Likewise the current from transistor tr5b splits between tr2a and tr2b.

According to an aspect of the invention, the complementary signals (I, Ī) may be generated by the DSP 710 such that only one of tr4b and tr5b passes current at one time, tr4b passing current for modulating waveform segments where the desired I signal is positive and tr5b passing current during segments where the desired I signal is negative. For example, a sigma-delta representation of the I signal from the signal processor 710 would comprise a stream of binary 1's interspersed with binary 0's while the Ī signal was fixed at one polarity (disabling current source 730b). Alternatively, the I signal would be fixed at one polarity (disabling current source 730a) while the Ī signal alternated between binary 0 and 1 according to the sigma-delta pattern.

Figure 8A:
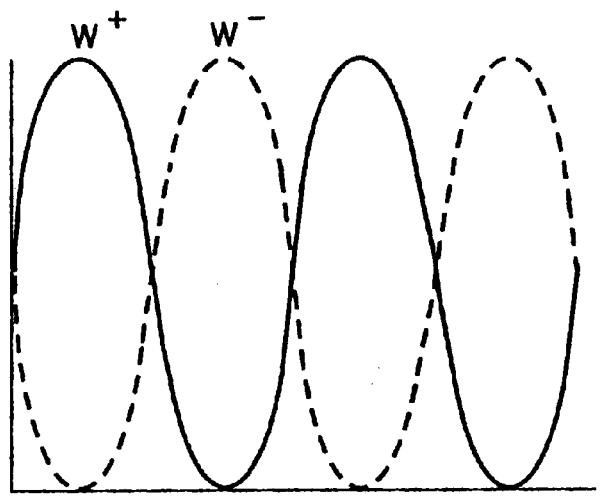
FIGS. 8A and 8B graphically illustrate complementary waveforms used in modulators of FIG. 1 and complementary waveforms that may be used in embodiments of the present invention, respectively.
Figure 8B:
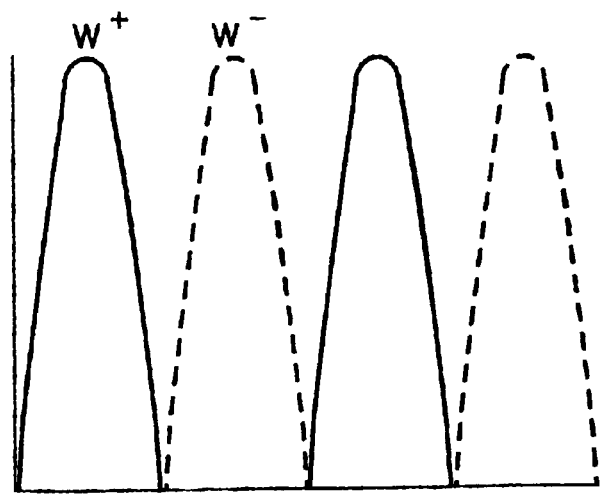

FIGS. 8A and 8B illustrate a difference between the complementary waveforms used in modulators such as shown in FIG. 1 and complementary waveforms for use in embodiments of the invention, respectively. The prior art complementary waveforms can be successfully used with the embodiments of modulators of FIG. 7, but these embodiments then may operate with about the same power conversion efficiency as a conventional Gilbert cell. This may be useful in order to allow a product to be upgraded piecemeal, by first replacing the modulator of FIG. 1 (e.g. the Gilbert cell of FIG. 2) with the modulator of FIG. 7 while keeping the DSP 110 unchanged, and later replacing the DSP 110 or its software to provide the DSP 710 of FIG. 7 and thereby to generate the complementary waveforms.

In FIGS. 8A and 8B, the prior art waveform and its complementary waveform, designated $W^+$ and $W^-$, have the property that their difference is the desired I or Q modulating signal. When the desired modulating signal is a sine wave, the prior art complementary waveforms also are sine waves, one inverted compared to the other. The mean current in each waveform is half the peak current in the waveforms of FIG. 8A.

The complementary waveforms of FIG. 8B also have the property that their difference is the desired modulating waveform. However, if the desired modulating waveform is a sine wave, the complementary waveforms comprise, respectively, only the positive half cycles or the negative half cycles. The waveforms are related to the prior art waveforms as the currents in a Class-A push-pull amplifier are related to the currents in a push-pull Class-B amplifier. The mean value of each current waveform in FIG. 8B is equal to $1/\pi$ times the peak current.

A difference between the prior art (Class-A-like) waveforms and the (Class-B-like) waveforms is that the former each have the same spectrum as the modulating signal, which is bandlimited to a desired bandwidth, while the latter, because they comprise only half cycles, generally do not have the same band-limitation as the desired modulation. This raises a concern as to how filter 740 will treat the non-bandlimited, class-B-like waveforms as compared to the prior art, class-A-like waveforms. However, this concern may be dismissed by the following argument:

The filtering function F of filter 740 is linear; therefore it has the property that:

$$F(W)=F(W^++W^-)=F(W^+)+F(W^-).$$

The above equation shows that the desired filtered waveform F(W) will be accurately reproduced by filtering $W^+$ and W separately. The filter may not reproduce exactly the abrupt cessation of the positive half current cycle nor the simultaneous commencement of the negative half cycle current, but these two departures from the ideal waveforms in theory cancel each other exactly. The effect of filter 740, when filtering Class-B waveforms, thus may be to prolong the positive half cycle of current flow to overlap with the negative half cycle flow somewhat, and vice-versa. This can reduce the efficiency of DC-to-RF power generation slightly, but the effect is negligible if the bandwidth of filter 740 is a few times the modulation signal bandwidth, as is usually the case in practice.

Embodiments of the invention generate complementary waveforms $W^+$ and $W^-$ by converting binary coded numerical waveform samples to high-bit rate sigma-delta representation. In the prior art, the sigma-delta representation of $W^-$ was just the Boolean complement of that for $W^+$, but this is not the case for embodiments of the invention. Specifically, embodiments for generating the waveforms divert binary coded numerical samples having a positive sign to a first sigma-delta converter to generate a representation for $W^+$, and divert samples having a negative sign to a second sigma-delta converter to produce a representation for $W^-$, as shown in FIG. 9.

Figure 9:
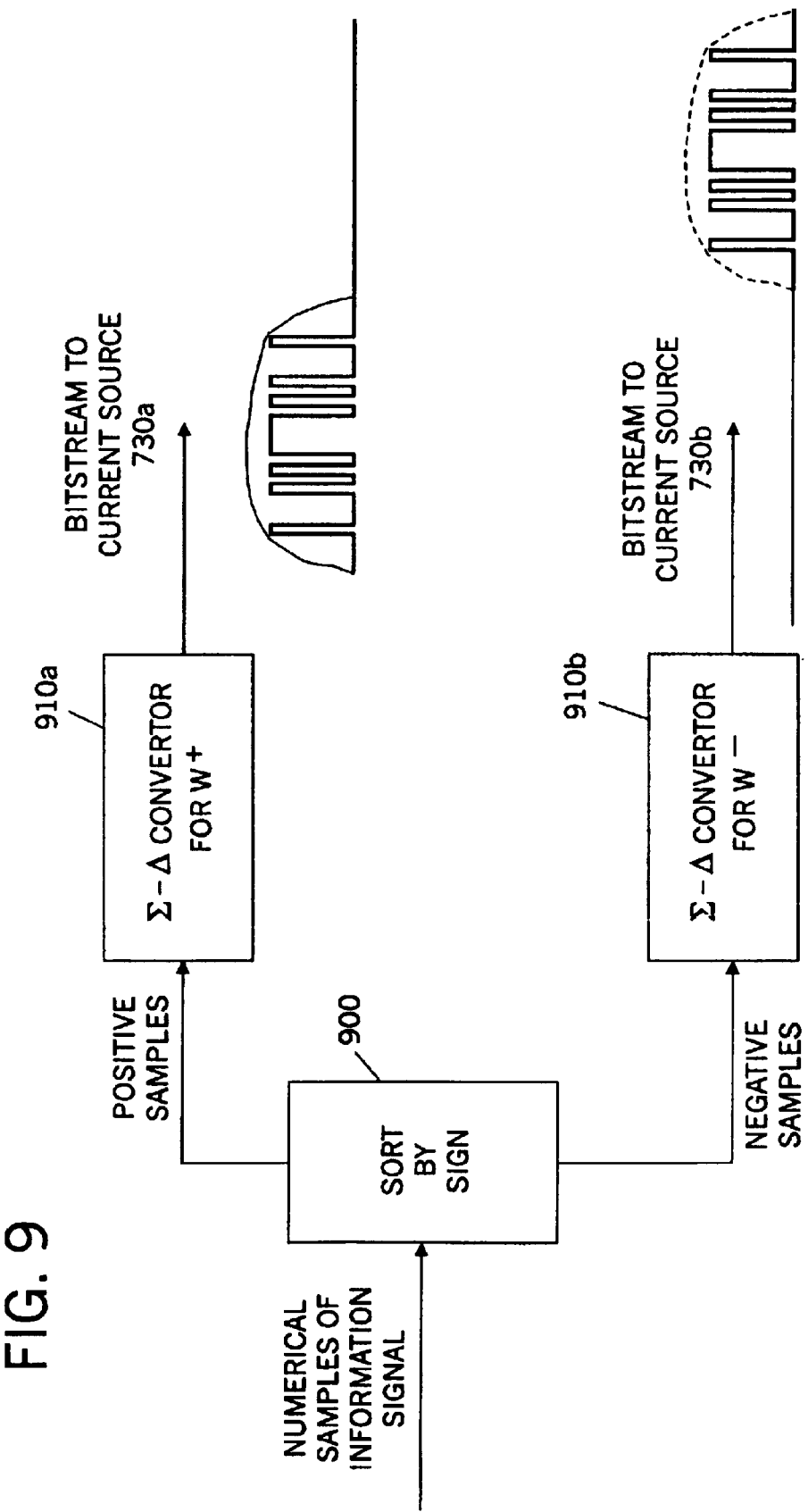
FIG. 9 is a block diagram of a waveform generator according to embodiments of the present invention.

Referring now to FIG. 9, a numerical sample stream representing a desired information signal is sorted by a sorter 900 into a stream comprising the positive samples, which are applied to a first sigma-delta converter 910a, and a stream comprising the negative samples, which are applied to a second sigma-delta converter 910b. The converters 910a and 910b can operate identically except that the negative values sorted to converter 910b are first inverted to positive values. The converters 910a and 910b output high bit rate binary streams in which the density of 1's represents the magnitude of the input values. When the input numerical values comprise several positive values in succession for a duration that is long compared with the sigma-delta bit rate, the converter 910b receives a zero input value during this time and the density of 1's falls to zero, i.e. a continuous '0' level is output, and conversely for converter 910a when successive numerical input values are negative.

Sigma-delta converters generally represent continuous waveforms with an imperfection known as quantizing noise. The quantizing noise is principally at frequencies close to half the bit rate, which, if much higher than the desired signal frequencies, can be removed by the low-pass filter 740. Sigma-delta converters of higher orders can be designed in which the quantizing noise power spectrum has a $f^{2N}$ shape with the ratio of energy at high frequencies to energy at low frequencies improving as the order 'n' is increased.

Figure 10:
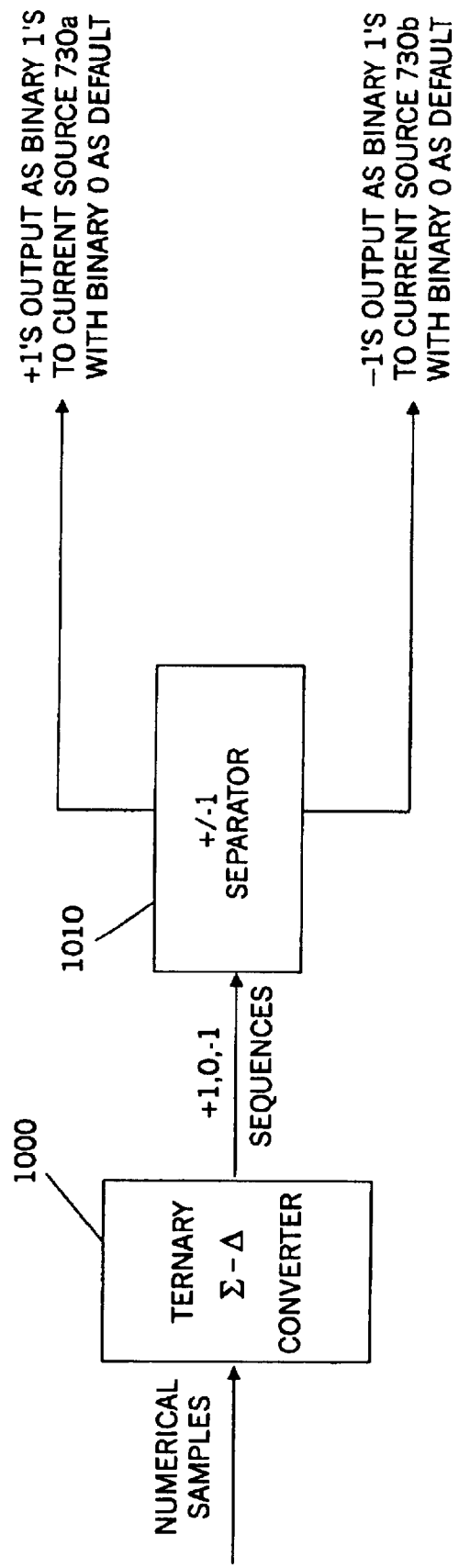
FIG. 10 is a block diagram of other embodiments of waveform generators according to the present invention.

Other embodiments that can reduce the quantizing noise of sigma-delta converters include allowing the converter to output ternary values of +1, 0 or −1. FIG. 10 illustrates the use of such an improved ternary converter 1000. The desired modulating signal samples (now both positive and negative values) are input to the converter 1000. The converter 1000 outputs a sequence of +1,0 or −1 values that best represents the desired modulating waveform with reduced and preferably minimum low-frequency quantizing noise. The +1 values are separated by a sorter 1010 to be sent to current source 730a as Boolean 1's, with Boolean 0's as default values when no +1 values are output. The sorter 1010 also separates −1 values to be sent to current source 730b as Boolean 1's with default value of Boolean 0. A Boolean "I" level is defined to be the logic level that enables a current source 730a or 730b. Due to the linearity of the filtering function F of the filter 740 discussed above, filtering the stream of +1's separately from the stream of −1's and then adding the results in the modulator of FIG. 7 can produce the same desired modulator output as filtering the stream of +1's, 0's and −1's in a single filter.

Still further improvements can be made to the quantizing noise if desired, by adding extra current sources to the current sources 730a, 730b. The extra current sources can generate a current smaller by some factor α than the currents of sources 730a, 730b. The extra current sources may be controlled by extra sigma-delta streams that represent the inverse of the low-frequency quantizing noise produced by the switched current sources 730a, 730b, thereby substantially canceling the low frequency quantizing noise. Such compound sigma-delta converters are well known to those having skill in the art and can be used with embodiments of the present invention as indicated above to obtain improved performance.

Class-B Gilbert cells according to the invention can have an improved efficiency of conversion of power due to the mean DC current consumption being reduced from 2·Io to (4/π)·Io for the same signal current output from FIG. 7 as from FIG. 1. This can provide an improvement factor of π/2 in efficiency. Moreover, a practical difference between FIG. 7 and the prior art of FIGS. 1 and 2 is that embodiments of Class-B modulators of FIG. 7 can remain linear up to the maximum current or beyond, being limited instead by output voltage saturation. In contrast, a prior art modulator of FIG. 1 generally is operated with back-off from the maximum current swing in order to maintain linearity. In addition, there generally is a lower loss of battery voltage in the division of Vcc between the current mirrors (tr4a, tr4b, tr5a, tr5b) and the switching transistors (tr1a, tr1b, tr2a, tr2b) than in the division between the tail transistors (TR3a, TR3b) and the switching transistors (TR1A, TR1B, TR2A, TR2B) of the prior art Gilbert-cell modulator of FIG. 2. Consequently it may be possible to reach output voltage amplitudes of 0.7 Vcc instead of only 0.5 Vcc.

Taking into account all of these factors, embodiments of Class-B modulators of FIG. 7 may yield efficiency improvements of between 2 and 4, that is between 3 dB and 6 dB more useful signal power output for the same DC power consumption. This extra power output also can equate to an improved signal-to-noise ratio at the output, and the gain of a transmit power amplifier that follows the modulator can be reduced by an equivalent amount to reduce broadband noise out of the transmitter. This reduction in broadband noise may allow the elimination of one or more of the Surface Acoustic Wave (SAW) filters that were used in prior art cellular radiotelephone phone transmitters to reduce broadband noise at the cellular radiotelephone phone receiver frequency. This can reduce the size and cost of cellular radiotelephones and can reduce the current consumption.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A modulator that modulates an information signal onto a carrier signal to produce a modulated information signal, the modulator comprising:

a generating circuit that produces a first modulating signal that corresponds to those portions of the information signal having positive values and a second modulating signal that corresponds to those portions of the information signal having negative values;

a first half modulator that modulates the carrier signal with the first modulating signal to produce a first half modulated signal;

a second half modulator that modulates the carrier signal with the second modulating signal to produce a second half modulated signal; and a combining circuit that combines the first half modulated signal and the second half modulated signal to produce the modulated information signal.

2. The modulator according to claim 1 wherein the generating circuit comprises a sorter that sorts the portions of the information signal having positive values and the portions of the information signal having negative values to produce the first and second modulating signals.

3. The modulator according to claim 1 wherein the generating circuit comprises:

a first sigma-delta converter that is responsive to the portions of the information signal having positive values to produce the first modulating signal as a first sigma-delta bitstream; and a second sigma-delta converter that is responsive to the portions of the information signal having negative values to produce the second modulating signal as a second sigma-delta bitstream.

4. The modulator according to claim 3 further comprising:

a first current source that is enabled and disabled in response to the first sigma-delta bitstream, wherein the first half modulator modulates the carrier signal in response to the first current source to produce the first half modulated signal; and a second current source that is enabled and disabled in response to the second sigma-delta bitstream, wherein the second half modulator modulates the carrier signal in response to the second current source to produce the second half modulated signal.

5. The modulator according to claim 4 further comprising:
a first low pass filter that connects the first current source to the first half modulator; and
a second low pass that connects the second current source to the second half modulator.

6. The modulator according to claim 1 further comprising:
a first current source that is enabled and disabled in response to the first modulating signal, wherein the first half modulator modulates the carrier signal in response to the first current source to produce the first half modulated signal; and
a second current source that is enabled and disabled in response to the second modulating signal, wherein the second half modulator modulates the carrier signal in response to the second current source to produce the second half modulated signal.

7. The modulator according to claim 6 further comprising:
a first low pass filter that connects the first current source to the first half modulator; and
a second low pass filter that connects the second current source to the second half modulator.

8. The modulator according to claim 1:
wherein the first half modulator comprises a first current mirror circuit that is responsive to the first modulating signal to produce a current scaled replica of the first modulating signal; and
wherein the second half modulator comprises a second current mirror circuit that is responsive to the second modulating signal to produce a current scaled replica of the second modulating signal.

9. The modulator according to claim 8:
wherein the first half modulator further comprises a first switching circuit that switches the current scaled replica of the first modulating signal at a rate that is based upon the carrier signal; and
wherein the second half modulator further comprises a second switching circuit that switches the current scaled replica of the second modulating signal at a rate that is based upon the carrier signal.

10. The modulator according to claim 1 wherein the combining circuit comprises a node that directly couples the first half modulated signal and the second half modulated signal to produce the modulated information signal.

11. The modulator according to claim 1 wherein the information signal is a ternary valued information signal comprising a stream of ternary digits each having notational values of +1, 0 and −1, and wherein the generating circuit produces the first modulating signal that comprises first logic levels that correspond to the ternary digits having +1 notational values and second logic levels, and the second modulating signal that comprises first logic levels that correspond to the ternary digits having −1 notational values and second logic levels.

12. The modulator according to claim 11 further comprising:
a first current source that is enabled by the first logic levels of the first modulating signal and is disabled by the second logic levels of the first modulating signal, wherein the first half modulator modulates the radio frequency carrier signal in response to the first current source to produce the first half modulated signal; and
a second current source that is enabled by the first logic levels of the second modulating signal and is disabled by the second logic levels of the second modulating signal, wherein the second half modulator modulates the radio frequency carrier signal in response to the second current source to produce the second half modulated signal.

13. The modulator according to claim 12 further comprising:
a first low pass filter that connects the first current source to the first half modulator; and
a second low pass filter that connects the second current source to the second half modulator.

14. A quadrature modulator that modulates an information signal onto a carrier signal to produce a modulated information signal, the quadrature modulator comprising:
a generating circuit that produces in-phase (I) samples and quadrature (Q) samples of the information signal;
a converter that converts the I samples of the information signal into a continuous I waveform and a continuous complementary-I waveform, and that also converts the Q samples of the information signal into a continuous Q waveform and a continuous complementary-Q waveform;
at least one current mirror that is responsive to the converter to produce proportional currents that are proportional to the continuous I waveform, the continuous complementary-I waveform, the continuous Q waveform and the continuous complementary-Q waveform; and
a switching circuit that alternatingly switches the proportional currents to first and second output terminals under control of switching signals at a frequency of the carrier signal to produce the modulated information signal at the first and second output terminals.

15. The quadrature modulator according to claim 14:
wherein the converter converts the I samples into a continuous I waveform and a continuous complementary-I waveform such that a difference between the continuous I waveform and the continuous complementary-I waveform represents a real part of the information signal; and
wherein the converter converts the Q samples into a continuous Q waveform and a continuous complementary-Q waveform such that a difference between the continuous Q waveform and the continuous complementary-Q waveform represents an imaginary part of the information signal.

16. The quadrature modulator according to claim 14:
wherein the converter converts the I samples into a continuous I waveform and a continuous complementary-I waveform such that the continuous I waveform represents positive portions of a real part of the information signal and the continuous complementary-I waveform represents negative portions of the real part of the information signal; and
wherein the converter converts the Q samples into a continuous Q waveform and a continuous complementary-Q waveform such that the continuous Q waveform represents positive portions of an imaginary part of the information signal and the continuous complementary-Q waveform represents negative portions of the imaginary part of the information signal.

17. The quadrature modulator according to claim 14 wherein the generating circuit comprises at least one sigma-delta converter.

18. A quadrature modulator comprising:
a quadrature splitter; and
a pair of Gilbert Multiplier Cells coupled to the quadrature splitter, each of which is biased in Class-B.

19. The quadrature modulator according to claim 18 wherein each of the Gilbert Multiplier Cells comprises:
a pair of cross-coupled emitter-coupled transistor pairs; and at least one current mirror circuit that is coupled to at least one of the emitter-coupled transistor pairs.

20. The quadrature modulator according to claim 18 further comprising:
at least one current source that selectively applies current to the pair of Gilbert Multiplier Cells to thereby bias the pair of Gilbert Multiplier Cells in Class-B.

21. The quadrature modulator according to claim 19 further comprising:
at least one current source that selectively applies current to the at least one current mirror circuit to thereby bias the pair of Gilbert Multiplier Cells in Class-B.

22. A Gilbert Multiplier Cell comprising:
a pair of cross-coupled emitter-coupled transistor pairs;
a driver circuit that is coupled to at least one of the emitter-coupled transistor pairs and that is biased in Class-B; and
a first current mirror circuit that is coupled to the emitters of the first of the cross-coupled emitter-coupled pairs and a second current mirror circuit that is coupled to the emitters of the second of the cross-coupled emitter-coupled pairs.

23. The Gilbert Multiplier Cell according to claim 22 wherein the driver circuit comprises at least one current source that selectively applies current to the first current mirror circuit.

24. A Gilbert Multiplier Cell comprising:
a pair of cross-coupled emitter-coupled transistor pairs;
a driver circuit that is coupled to at least one of the emitter-coupled transistor pairs and that is biased in Class-B; and
at least one current source that selectively applies current to at least one of the emitter-coupled transistor pairs.

25. The Gilbert Multiplier Cell according to claim 24 wherein the driver circuit further comprises at least one current mirror circuit that is coupled to at least one of the emitter-coupled transistor pairs.

26. A wireless terminal comprising:
a processor that processes input signals; and
a quadrature modulator that is responsive to the processor, the quadrature modulator comprising a quadrature splitter, and a pair of Gilbert Multiplier Cells coupled to the quadrature splitter, each of which is biased in Class-B.

27. The wireless terminal according to claim 26 wherein each of the Gilbert Multiplier Cells comprises:
a pair of cross-coupled emitter-coupled transistor pairs; and
at least one current mirror circuit that-is coupled to at least one of the emitter-coupled transistor pairs.

28. The wireless terminal according to claim 26 further comprising:
at least one current source that selectively applies current to the pair of Gilbert Multiplier Cells to thereby bias the pair of Gilbert Multiplier Cells in Class-B.

29. The wireless terminal according to claim 27 further comprising:
at least one current source that selectively applies current to the at least one current mirror circuit to thereby bias the pair of Gilbert Multiplier Cells in Class-B.

30. A method of modulating an information signal onto a carrier signal to produce a modulated information signal, the method comprising:
producing a first modulating signal that corresponds to those portions of the information signal having positive values and a second modulating signal that corresponds to those portions of the information signal having negative values;
modulating the carrier signal with the first modulating signal to produce a first half modulated signal;
modulating the carrier signal with the second modulating signal to produce a second half modulated signal; and
combining the first half modulated signal and the second half modulated signal to produce the modulated information signal.

31. The method according to claim 30 wherein producing a first modulating signal that corresponds to those portions of the information signal having positive values and a second modulating signal that corresponds to those portions of the information signal having negative values comprises sorting the portions of the information signal having positive values and the portions of the information signal having negative values to produce the first and second modulating signals.

32. The method according to claim 30 wherein producing a first modulating signal that corresponds to those portions of the information signal having positive values and a second modulating signal that corresponds to those portions of the information signal having negative values comprises:
sigma-delta converting the portions of the information signal having positive values to produce the first modulating signal as a first sigma-delta bitstream; and
sigma-delta converting the portions of the information signal having negative values to produce the second modulating signal as a second sigma-delta bitstream.

33. The method according to claim 32 further comprising:
enabling and disabling a first current source in response to the first sigma-delta bitstream; and
enabling and disabling a second current source in response to the second sigma-delta bitstream.

34. The method according to claim 33 further comprising:
low pass filtering the first current source; and
low pass filtering the second current source.

35. The method according to claim 30 further comprising:
enabling and disabling a first current source in response to the first modulating signal; and
enabling and disabling a second current source in response to the second modulating signal.

36. The method according to claim 35 further comprising:
low pass filtering the first current source; and
low pass filtering the second current source.

37. The method according to claim 30:
wherein modulating the carrier signal with the first modulating signal to produce a first half modulated signal comprises producing a current scaled replica of the first modulating signal; and
wherein modulating the carrier signal with the second modulating signal to produce a second half modulated signal comprises producing a current scaled replica of the second modulating signal.

38. The method according to claim 37:
wherein modulating the carrier signal with the first modulating signal to produce a first half modulated signal comprises switching the current scaled replica of the first modulating signal at a rate that is based upon the carrier signal; and
wherein modulating the carrier signal with the second modulating signal to produce a second half modulated signal comprises switching the current scaled replica of the second modulating signal at a rate that is based upon the carrier signal.

39. The method according to claim 30 wherein combining the first half modulated signal and the second half modulated signal to produce the modulated information signal comprises directly coupling the first half modulated signal and the second half modulated signal to produce the modulated information signal.

40. The method according to claim 30 wherein the information signal is a ternary valued information signal comprising a stream of ternary digits each having notational values of +1, 0 and −1, and wherein producing a first modulating signal that corresponds to those portions of the information signal having positive values and a second modulating signal that corresponds to hose portions of the information signal having negative values comprises producing the first modulating signal that comprises first logic levels that correspond to the ternary digits having +1 notational values and second logic levels, and producing the second modulating signal that comprises first logic levels that correspond to the ternary digits having −1 notational values and second logic levels.

41. The method according to claim 40 further comprising:

enabling a first current source by the first logic levels of the first modulating-signal and disabling the first current source by the second logic levels of the first modulating signal; and enabling a second current source by the first logic levels of the second modulating signal and disabling the second current source by the second logic levels of the second modulating signal.

42. The method according to claim 41 further comprising:

low pass filtering the first current source; and low pass filtering the second current source.

43. A quadrature modulating method that modulates an information signal onto a carrier signal to produce a modulated information signal, the quadrature modulating method comprising:

producing in-phase (I) samples and quadrature (Q) samples of the information signal;

converting the I samples of the information signal into a continuous I waveform and a continuous complementary-I waveform, and converting the Q samples of the information signal into a continuous Q waveform and a continuous complementary-Q waveform;

producing proportional currents that are proportional to the continuous I waveform, the continuous complementary-I waveform, the continuous Q waveform and the continuous complementary-Q waveform; and alternatingly switching the proportional currents to first and second output terminals under control of switching signals at a frequency of the carrier signal to produce the modulated information signal at the first and second output terminals.

44. The method according to claim 43 wherein converting the I samples of the information signal into a continuous I waveform and a continuous complementary-I waveform, and converting the Q samples of the information signal into a continuous Q waveform and a continuous complementary-Q waveform comprises:

converting the I samples into a continuous I waveform and a continuous complementary-I waveform such that a difference between the continuous I waveform and the continuous complementary-I waveform represents a real part of the information signal; and converting the Q samples into a continuous Q waveform and a continuous complementary-Q waveform such that a difference between the continuous Q waveform and the continuous complementary-Q waveform represents an imaginary part of the information signal.

45. The method according to claim 43 wherein converting the I samples of the information signal into a continuous I waveform and a continuous complementary-I waveform, and converting the Q samples of the information signal into a continuous Q waveform and a continuous complementary-Q waveform comprises:

converting the I samples into a continuous I waveform and a continuous complementary-I waveform such that the continuous I waveform represents positive portions of a real part of the information signal and the continuous complementary-I waveform represents negative portions of the real part of the information signal; and converting the Q samples into a continuous Q waveform and a continuous complementary-Q waveform such that the continuous Q waveform represents positive portions of an imaginary part of the information signal and the continuous complementary-Q waveform represents negative portions of the imaginary part of the information signal.

46. The method according to claim 43 wherein producing proportional currents that are proportional to the continuous I waveform, the continuous complementary-I waveform, the continuous Q waveform and the continuous complementary-Q waveform comprises sigma-delta converting the I samples and the Q samples of the information signal.

47. A quadrature modulation method comprising:

generating in-phase and quadrature carrier signals;

biasing a pair of Gilbert Multiplier Cells in Class-B; and applying the in-phase and quadrature carrier signals and in-phase and quadrature information signals to the pair of Gilbert Multiplier Cells that are biased in Class-B.

48. The quadrature modulation method according to claim 47 wherein applying the in-phase and quadrature carrier signals and in-phase and quadrature information signals to the pair of Gilbert Multiplier Cells that are biased in Class-B comprises:

mirroring the in-phase and quadrature information signals as scaled currents in the Gilbert Multiplier Cells that are biased in Class-B.

49. A method of operating Gilbert Multiplier Cell comprising:

biasing the Gilbert Multiplier Cell in Class-B;

wherein biasing the Gilbert Multiplier Cell in Class B comprises selectively applying current from at least one current source to the Gilbert Multiplier Cell.

50. The method according to claim 49 wherein biasing the Gilbert Multiplier Cell in Class-B further comprises:

mirroring a current in the Gilbert Multiplier Cell.

* * * * *

UNITED STATES PATENT AND TRADEMARK OFFICE
CERTIFICATE OF CORRECTION

| | |
|---|---|
| PATENT NO. | : 6,768,391 B1 |
| APPLICATION NO. | : 09/602385 |
| DATED | : July 27, 2004 |
| INVENTOR(S) | : Dent et al. |

It is certified that error appears in the above-identified patent and that said Letters Patent is hereby corrected as shown below:

On the Face Page, in Field (56), under "U.S. PATENT DOCUMENTS", in Column 1, Line 3, delete "375/398" and insert -- 375/298 --, therefor.

On the Face Page, in Field (57), under "ABSTRACT", in Column 2, Line 7, delete "transistor pairs" before "and a driver".

In Column 5, Line 21, delete " $1(\sqrt{2}/\pi)$ " and insert -- $1/(\sqrt{2} \cdot \pi)$ --, therefor.

In Column 9, Line 37, after "thereof" insert -- . --.

In Column 10, Line 36, delete "W" and insert -- W' --, therefor.

In Column 11, Line 16, delete "$f^{2N}$" and insert -- $f^{2n}$ --, therefor.

In Column 11, Line 31, delete ""I"" and insert -- "1" --, therefor.

In Column 15, Line 48, in Claim 27, delete "that-is" and insert -- that is --, therefor.

In Column 17, Line 7, in Claim 40, delete "hose" and insert -- those --, therefor.

Signed and Sealed this

Twenty-second Day of July, 2008

JON W. DUDAS
*Director of the United States Patent and Trademark Office*